United States Patent
Yamaoka

(10) Patent No.: US 7,404,908 B2
(45) Date of Patent: Jul. 29, 2008

(54) PRINTED WIRING BOARD MANUFACTURING METHOD

(75) Inventor: Tsutomu Yamaoka, Fujisawa (JP)

(73) Assignee: Maruwa Corporation, Fujisawa (JP)

( * ) Notice: Subject to any disclaimer, the term of this patent is extended or adjusted under 35 U.S.C. 154(b) by 135 days.

(21) Appl. No.: 11/242,483

(22) Filed: Oct. 3, 2005

(65) Prior Publication Data
US 2006/0084011 A1    Apr. 20, 2006

(30) Foreign Application Priority Data
Oct. 4, 2004  (JP) ............................ 2004-291202
Sep. 7, 2005  (JP) ............................ 2005-259069

(51) Int. Cl.
*H01B 13/00* (2006.01)
*H01K 3/10* (2006.01)
(52) U.S. Cl. ........................... 216/18; 29/852
(58) Field of Classification Search ................ 216/18, 216/19; 29/829, 846, 852
See application file for complete search history.

(56) References Cited

U.S. PATENT DOCUMENTS 4,889,790 A * 12/1989 Roos et al. .................. 430/258

FOREIGN PATENT DOCUMENTS

JP       06177505 A  *  6/1994
JP       11-195849        7/1999

* cited by examiner

*Primary Examiner*—Roberts Culbert
(74) *Attorney, Agent, or Firm*—Jordan and Hamburg LLP

(57) ABSTRACT

According to this manufacturing method, a copper foil is attached to both sides of an insulating material to form a substrate. First, a large number of through-holes is made in the substrate and the inside of the through-holes is made electrically conductive. Then, after one side of the substrate is coated with a photosensitive dry film having an outer masking layer attached thereto, a developing solution is caused to infiltrate into the through-bores from the other side to develop the photosensitive dry film as a plating resist. The photosensitive dry film is then exposed to be hardened. The outer masking layer is removed to copper-electroplate the inside of the through-holes and the like. Finally, the photosensitive dry film is removed to form a circuit pattern.

8 Claims, 5 Drawing Sheets

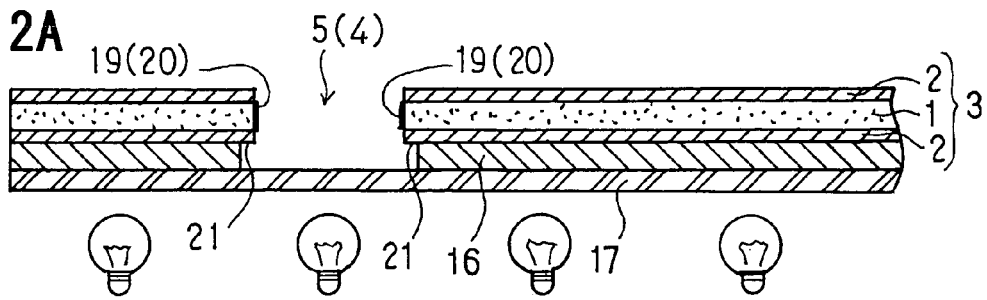
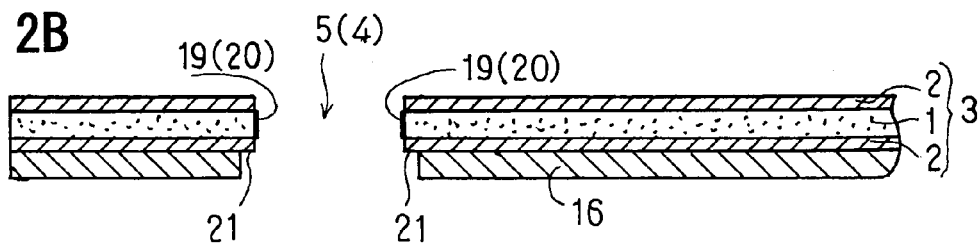
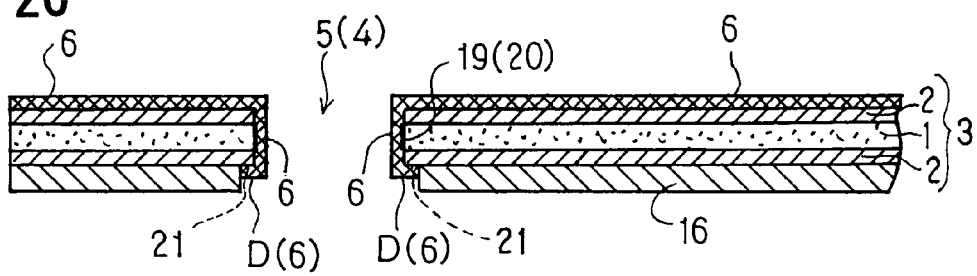
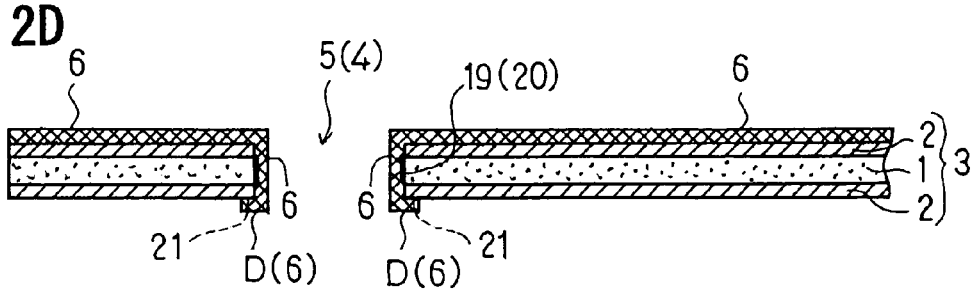
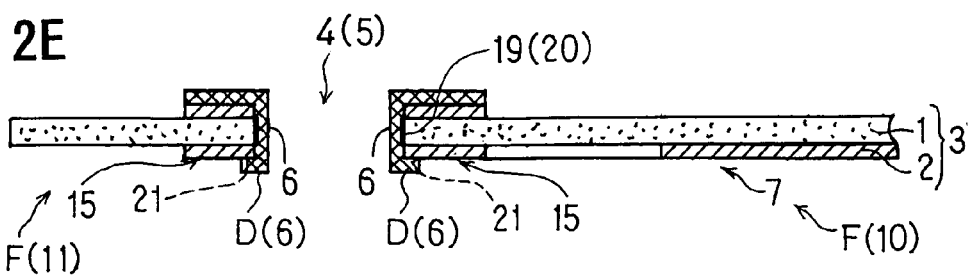

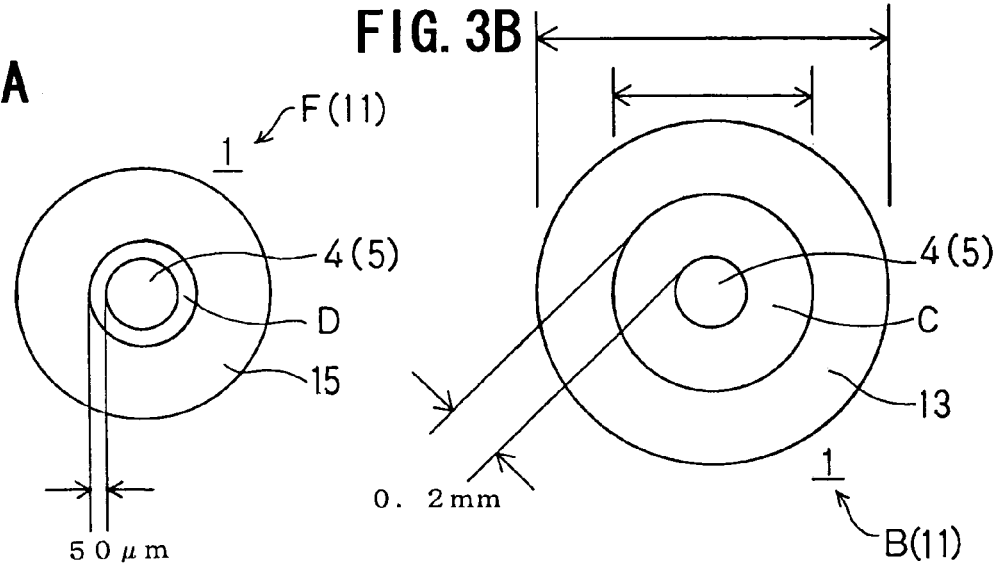

PRINTED WIRING BOARD MANUFACTURING METHOD

BACKGROUND OF THE INVENTION

1. Technical Field

The present invention relates to a printed wiring board manufacturing method, and in particular to a printed wiring board manufacturing method whereby a circuit pattern is formed on both sides of an insulating material.

2. Background of the Art

<<Technological Background>>

A printed wiring board, for example, a flexible printed wiring board provided with flexibility and bendability has made remarkable progress in precision, function, thickness and weight. In particular, high density and miniaturization of a formed circuit pattern is outstanding.

A large number of minute through-holes is made in a printed wiring board for connecting a circuit pattern on both sides and for mounting semiconductor parts and the like. Two major methods for making such a through-hole during the process for manufacturing the printed wiring board are a panel plating method and a button plating method.

FIG. 4 is an explanatory front cross-sectional view showing an enlarged substantial part provided to explain a conventional printed wiring board manufacturing method of this kind. FIG. 4A shows a printed wiring board manufactured according to a panel plating method. FIG. 4B shows a coating process according to a button plating method, FIG. 4C shows an exposure process according to the button plating method and FIG. 4D shows a printed wiring board manufactured by the button plating method.

<<Panel Plating Method>>

Referring to a panel plating method as shown in FIG. 4A, a copper foil 2 is attached to both sides (i.e., front side and rear side) of an insulating material 1 to form a substrate 3. After a through-hole 5 for a through-hole 4 is made in the substrate 3, the inner wall surface and the like of the through-hole 5 are made electrically conductive. Then, copper electroplating 6 is applied on the entire substrate 3. In this case, the copper electroplating 6 is not only applied on the inner wall surface of the through-hole 5 of the substrate 3 which becomes electrically conducting, but also on the copper foil 2 attached to both sides.

A through-hole 5 of the substrate 3 is made electrically conducting by such a copper electroplating 6 to obtain electrical conduction on both sides. A circuit pattern 7 is thus formed by going through known steps such as exposure, development, etching and stripping in that order. In this manner, a printed wiring board A as shown in FIG. 4A, for example, a flexible printed wiring board is manufactured.

<<Button Plating Method>>

In the case of a button plating method shown in FIGS. 4B, 4C and 4D, a copper foil 2 is attached to both sides (front side and rear side) of an insulating material 1 to form a substrate 3 in the same manner as the panel plating method described above. A through-hole 5 for a through-hole 4 is made in the substrate 3 before the inner wall surface of the through-hole 5 becomes electrically conducting.

As shown in FIG. 4B, both sides of the substrate 3 are first coated with a photosensitive dry film 8 having a separator attached thereto. As shown in FIG. 4C, a photo mask 9, which is a negative mask, is positioned on the outside of the photosensitive dry film 8 to be exposed and developed by a developing solution.

The photosensitive dry film 8 remains hard except for the vicinity of an opening section of the through-hole 5 of the substrate 3. Copper electroplating 6 is applied on such a hardened photosensitive dry film 8 making it a plating resist. In other words, the copper electroplating 6 has been selectively implemented only on the electrically conducting inner wall surface of the through-hole 5 and the periphery of the opening section of the through-hole 5 on both sides. In this manner, the copper electroplating 6 is formed on the inner wall surface of the through-hole 5 (through-hole 4) and the periphery of the opening section of the through-hole 5 (through-hole 4) on both sides. In this case, the copper electroplating 6 is formed as a substantially button shaped section C.

In this manner, the through-hole 5 becomes electrically conducting to obtain electrical conduction on both sides. The substrate 3 is formed with a circuit pattern 7 by going through the known steps. As a result, as shown in FIG. 4D, a printed wiring board B, for example, a flexible printed wiring board, is manufactured.

<<Prior-Art Document Information>>

A conventional printed wiring board manufacturing method according to such a button plating method is disclosed in the following Patent Document 1.

Patent Document 1: Japanese Unexamined Patent Publication No. 195849/1999

3. Problems to be Solved by the Invention

The following problems have been pointed out in such a conventional printed wiring board manufacturing method.

<<First Problem>>

In a method for manufacturing a printed wiring board A according to a panel plating method, it is pointed that the manufactured printed wiring board A, in particular, a flexible printed wiring board, has a problem with flexibility and bendability.

In the panel plating method, as described above, a copper electroplating 6 is applied not only on a through-hole 5, but also on a copper foil 2 on both sides (front side and rear side) of a substrate 3. In other words, in this substrate 3, copper has been separated out even from the outer surface of a copper foil 2 on both sides for forming a circuit pattern 7 for electrical conduction of the through-hole 5 (the through-hole 4).

Referring to the printed wiring board A manufactured in this manner, since the copper electroplating 6 is thoroughly applied on the outer surface of all the circuit patterns 7 formed on both sides, flexibility and bendability has deteriorated accordingly.

The printed wiring board A manufactured by the panel plating method has a problem with flexibility in that, for example, a bendable wiring section 10 as shown in a schematic plan view of FIG. 5 cannot be readily folded or bent in use. This problem is particularly remarkable in the flexible printed wiring board.

<<Second Problem>>

In the manufacturing method of the printed wiring board A according to the panel plating method, it is pointed out that the printed wiring board A has a problem with weight and thickness. It is also pointed out that there is a problem in high density and miniaturization of the circuit pattern 7.

Namely, in the printed wiring board A manufactured by the panel plating method, as described in the first problem, the copper electroplating 6 is thoroughly applied even on the outer surface of all the circuit patterns 7 formed on both sides (front side and rear side). It is therefore pointed out that the printed wiring board A has more weight and thickness and goes against the progress of lightness in weight and reduction in thickness.

Referring to the formation of the circuit pattern 7 on both sides in a final process, it is pointed out that the copper electroplating 6 formed on the outer surface of the copper foil 2 of the substrate 3 works against etching and it is difficult to form the high-density, miniaturized circuit pattern 7.

<<Third Problem>>

In the manufacturing method of a printed wiring board B according to a button plating method, it is pointed out that there is a problem in that the manufacturing process is long and complicated, and the process yield is poor and, as a result, affects the cost.

As described above, in the button plating method, since an exposure process and a developing process using the photosensitive dry film 8 and a photo mask 9 for the plating resist are needed prior to the copper electroplating of the substrate 3, this makes the manufacturing process complicated and troublesome.

Further, a location of the through-hole 5 on the substrate 3 side and a location of the photo mask 9 side corresponding to the through-hole 5 are visually positioned, but this positioning operation is not easy but very troublesome.

Thus, the button plating method not only improves the drawbacks of the panel plating method described above, but also excels in flexibility and bendability because the copper electroplating 6 is applied only in the vicinity of the through-hole 4. Further, the button plating method has no problem with weight and thickness and can respond to the high density and miniaturization as well. However, it is pointed out that this button plating method has a complicated and troublesome process, of which the yield is poor, and has a big problem with cost.

<<Fourth Problem>>

In the manufacturing method of a printed wiring board B according to the button plating method, it is pointed out that the manufacture printed wiring board B also has a problem with the positioning accuracy and the like of the copper electroplating 6 on the through-hole 4.

Namely, in the case of the button plating method, as described in the third problem above, positioning of the through-hole 5 of the substrate 3 and the photo mask 9 is conducted, but displacement therebetween often occurs. In other words, since this positioning is often visually conducted, it is difficult to ensure correct positioning because there is possible expansion and contraction in the substrate 3 and the photo mask 9.

Referring to the printed wiring board B manufactured by the button plating method, it is pointed out that there is a drawback in the positioning accuracy of the copper electroplating 6 in the vicinity of the through-hole 5 and the printed wiring board B does not exhibit the rapid progress in high precision.

Further, as shown in an explanatory plan view of FIG. 3B, it is difficult to miniaturize the copper electroplating 6, that is, a button section C, formed in a button shape on the periphery of an opening section of the through-hole 4 due to the problem with such positioning accuracy. As a result, the button section C cannot help having a larger diameter of about 0.2 mm. In this manner, since the button section C has a larger diameter, the diameter of a land 13 formed in response to the circuit pattern 7 also becomes large.

Referring further to the printed wiring board B manufactured by the button plating method, as shown in an explanatory plan view of FIG. 3D, the amount of wiring of the circuit pattern 7 to be put between the lands 13 is small and the wiring density also tends to be limited to a lesser amount. Accordingly, it is pointed out that the printed wiring board B does not exhibit the rapid progress in high function.

SUMMARY OF THE INVENTION

<<Present Invention>>

A printed wiring board manufacturing method according to the present invention was created to solve the problems stated above as a result of assiduous study efforts by the inventor in view of such an actual situation.

The printed wiring board manufacturing method comprises the steps of: making a through-hole of a substrate electrically conductive; coating the substrate with a photosensitive dry film and the like; allowing a developing solution to infiltrate into the through-hole; developing the photosensitive dry film as a plating resist; and copperizing the through-hole.

It is therefore an object of the present invention to provide an improved printed wiring board manufacturing method which, first, excels in flexibility and bendability, second, can improve lightness in weight, reduction in thickness, high density and miniaturization, third, excels in cost reduction due to simplified processes, and fourth, can improve the precision and the like.

1. Means for Solving the Problems

Technical means for solving these problems are described hereunder.

A printed wiring board manufacturing method according to the invention comprises the steps of: making a large number of through-holes in a laminated sheet coated with copper; making the inside of the through-holes electrically conductive; coating one side of the laminated sheet with a photosensitive dry film having an outer masking layer attached thereto; allowing a developing solution to infiltrate into the through-holes from the other side; developing the photosensitive dry film as a plating resist for hardening; and stripping the outer masking layer.

The printed wiring board manufacturing method further comprises the steps of copperizing the through-holes and the periphery of the opening section thereof, removing the photosensitive dry film, and forming a circuit pattern.

The printed wiring board manufacturing method according to the invention also comprises the steps of: making a large number of through-holes in a laminated sheet coated with copper; making the inside of the through-holes electrically conductive; coating one side of the laminated sheet with a photosensitive dry film having an outer masking layer attached thereto; allowing a developing solution to infiltrate into the through-holes from the other side; developing the photosensitive dry film as a plating resist for hardening; and removing the outer masking layer.

The method further comprises the steps of: coating the other side of the laminated sheet with another photosensitive dry film having an outer masking layer attached thereto; allowing a developing solution to infiltrate into the through-holes from one side; developing the photosensitive dry film as a plating resist for hardening; and removing the outer masking layer.

The method still further comprises the steps of: copperizing the through-holes and the periphery of an opening section thereof on both sides; removing both photosensitive dry films; and forming a circuit pattern.

The printed wiring board manufacturing method according to the invention also comprises the steps of: making a large number of through-holes in a substrate made of a laminated sheet of which both sides of the insulating material are coated with a copper foil; and forming a conductive film on the inner wall surface of the through-holes.

The manufacturing method further comprises the steps of: coating the whole area of one side of the substrate with the photosensitive dry film having an outer masking layer attached thereto; and allowing a developing solution to infiltrate into the through-holes from the other side of the substrate to dissolve and remove the photosensitive dry film in the vicinity of the opening of one side of the through-holes by a developing solution, thereby developing the photosensitive dry film as a plating resist for hardening.

The manufacturing method still further comprises the steps of: stripping the outer masking layer; copper-electroplating the substrate to separate out copper from the copper foil of the other side, from the conductive film of the inner wall surface of the through-holes, and from the periphery of an opening section of the through-holes on one side, and thereby realize the electrical conduction of the through-holes.

The manufacturing method further comprises the steps of: stripping the photosensitive dry film for removal; and forming a circuit pattern by the copper foil on both sides of the substrate.

The printed wiring board manufacturing method according to the invention is provided, in which the printed wiring board is a film-shaped, flexible printed wiring board.

The printed wiring board manufacturing method according to the invention is provided, in which the printed wiring board is a rigid printed wiring board.

The printed wiring board manufacturing method according to the invention is provided, in which an electrically conducting treatment within the through holes is implemented by a direct plating method whereby a film of palladium, carbon or other conductive material is formed, or an electroless copper plating method whereby a film is formed by an electroless copper plating.

The printed wiring board manufacturing method according to the invention is provided, in which infiltration of a developing solution into the through-holes is implemented by spraying the developing solution into the substrate or dipping the substrate into a developing solution tank.

The printed wiring board manufacturing method according to the invention is provided, in which formation of the circuit pattern is implemented in such a manner that the substrate is coated with a photosensitive resist film, the photosensitive resist film is then exposed, hardened, and developed using a circuit mask, and a copper foil of the substrate is etched to strip away the remaining photosensitive resist film.

2. Operation

Operation and the like of the present invention will be described hereunder. In this manufacturing method, a large number of through-holes is made in a substrate made of a laminated sheet coated with copper to form a conductive film on the inner wall surface of each through-hole, wherein one side of the substrate is coated with a photosensitive dry film and the like. A developing solution is infiltrated into the through-holes from the other side to develop the photosensitive dry film as a plating resist. After this, it is also possible to coat the other side of the substrate with a photosensitive dry film and the like, pour a developing solution into the through-holes from one side and develop the photosensitive dry film as a plating resist.

In this manufacturing method, the substrate is copper-electroplated. In other words, copper is separated out from the conductive film of the inner wall surface of the through-holes, from the periphery of the opening section of the through-holes on one side, and from the periphery of the opening section of the through holes on the other side to make the through holes electrically conductive.

A copper foil is pattered to form a circuit pattern, wherein a printed wiring board, that is, a flexible printed wiring board or a rigid printed wiring board is manufactured.

The operation according to the present invention is described as follows.

(1) First, in this manufacturing method, a substrate is masked using a photosensitive dry film to implement copper-electroplating. Accordingly, copper foil on one side or both sides is not copper-electroplated except for the periphery of the opening section of the through-holes.

Since the copper foil, that is, the circuit pattern, on one side or both sides is not copper electroplated, the manufactured printed wiring board excels in flexibility and bendability compared to the case where both sides are copper electroplated together. The printed wiring board corresponding to a bendable wiring section can be folded or bent smoothly.

(2) Second, in this manufacturing method, since the circuit pattern on one side or both sides is not copper electroplated, it is not only possible to make the printed wiring board light and thin, but also to form a high-density and miniaturized circuit pattern compared to the case where both sides are copper-electroplated.

(3) Third, in this manufacturing method, the photosensitive dry film is developed as a plating resist by a method whereby the developing solution is poured. The processes can therefore be simplified compared to a manufacturing method whereby the photosensitive dry film is utilized as a plating resist using a photo mask. For example, a troublesome positioning operation can be eliminated.

(4) Fourth, this manufacturing method is a method whereby a developing solution is poured. Therefore, the photosensitive dry film is correctly and evenly dissolved and removed only in the vicinity of the opening section of the through-holes and is precisely developed as a plating resist.

Accordingly, in this printed wiring board, a copper-electroplated button section can be formed on the periphery of the opening section of the through-holes with a high degree of accuracy of position and dimension without depending on visual inspection and being affected by expansion and contraction of the substrate and the photo mask. Further, the button section with a smaller diameter can also be formed to make the diameter of a land on the circuit pattern side smaller. As a result, since a space between the lands is created, it is possible to increase or change the amount and density of the wiring of the circuit pattern to be put therebetween.

3. Effects of the Invention

<<Features of the Invention>>

As described above, the printed wiring board manufacturing method according to the present invention comprises the steps of: making the through-holes of the substrate electrically conductive; coating the substrate with a photosensitive dry film or the like; pouring the developing solution into the through holes; developing the photosensitive dry film as a plating resist; and copper-electroplating the through-holes.

Effects of the present invention will now be described below.

<<First Effect>>

First, a printed wiring board which excels in flexibility and bendability can be obtained. Namely, in the manufacturing method according to the present invention, since the substrate is masked before conducting the copper electroplating, no copper electroplating is applied on the copper foil on one side or both sides.

Unlike the conventional manufacturing method of this kind according to the panel plating method as described above, the copper foil of the substrate on both sides is not copper-electroplated. Since the manufactured printed wiring board excels in flexibility and bendability, this can be smoothly folded or bent.

In the case of a flexible printed wiring board of which the primary function is flexibility, this is a very outstanding effect.

<<Second Effect>>

Second, a light, extremely thin, high-density and miniaturized printed wiring board can be obtained.

Namely, as described in the first effect, according to the manufacturing method of the present invention, the manufactured printed wiring board is provided in such a manner that the copper foil forming a circuit pattern on one side or both sides is not copper-electroplated.

Compared to the conventional method of the panel plating method of this kind in which the circuit patterns on both sides are thoroughly copper electroplated, a light and extremely thinned printed wiring board can be obtained and as a result, it is possible to fully cope with the progress of the lightness in weight and the extreme reduction in thinness. Further, since copper electroplating is not implemented in the case of formation of the circuit pattern, etching and the like can be smoothly carried out and as a result, a high-density, miniaturized circuit pattern can be formed.

<<Third Effect>>

Third, the process is simplified and excels in cost. Namely, the manufacturing method of the present invention adopts a method whereby the substrate is coated with the photosensitive dry film or the like before pouring a developing solution into the through-holes. With this method, the photosensitive dry film is developed as a plating resist.

Unlike the conventional method of the button plating method of this kind, as the manufacturing method of the present invention does not use a photo mask for forming the plating resist, the process is not only simplified, but also a troublesome positioning operation is not required.

According to the manufacturing method of the present invention, the process yield improves and reduction in cost can be realized.

<<Fourth Effect>>

Fourth, precision and the like also improve. As described in the third effect, since the manufacturing method of the present invention adopts a method for pouring a developing solution, the photosensitive resist can be accurately and evenly developed as a plating resist and as a result, copper electroplating is formed in a collar-shape, that is, in a button shape, on the periphery of the opening section.

Unlike the conventional method of this kind by the button plating method described above, the printed wiring board manufactured according to this manufacturing method neither depends on visual inspection nor is affected by expansion and contraction. Thus, the button section is formed on the periphery of the opening section of the through-holes with a high degree of accuracy and thus, it is also possible to fully cope with the progress of the substrate at high precision. Further, since a minute button section of a smaller diameter is formed to make the diameter of the land on the circuit pattern side smaller, enough space is created for wiring the circuit pattern between the lands. Accordingly, it is also possible to fully cope with the progress of the substrate in high function.

In this manner, all the existing problems found in the conventional method of this kind can be solved. It is therefore to be noted that the present invention has remarkable and great effects.

BRIEF DESCRIPTION OF THE DRAWINGS

The above and other objects, features and advantages of the present invention will become more apparent from the following description when taken in conjunction with the accompanying drawings.

FIG. 1 is an explanatory front cross-sectional view of an enlarged substantial part of one example provided to explain a preferred embodiment for implementing a printed wiring board manufacturing method according to the present invention, wherein

FIG. 2 is an explanatory front cross-sectional view showing an enlarged substantial part of one example provided to explain a preferred embodiment for implementing the present invention, wherein FIG. 2A shows an exposure process, FIG. 2B shows a stripping process, FIG. 2C shows a plating process, FIG. 2D shows a stripping process and FIG. 2E shows a printed wiring board manufactured through a patterning process;

FIG. 3 is provided to explain the best mode for implementing the present invention, wherein FIG. 3A is an explanatory plan view showing an enlarged substantial part of one example of a printed wiring board manufactured according to the present invention, FIG. 3B is an explanatory plan view showing an enlarged substantial part of a printed wiring board manufactured according to a conventional manufacturing method of this kind; FIG. 3C is an explanatory plan view showing an enlarged substantial part of one example of the printed wiring board manufactured according to the present invention, FIG. 3D is an explanatory plan view showing an enlarged substantial part of the printed wiring board manufactured according to a conventional manufacturing method of this kind and FIG. 3E is an explanatory front cross-sectional view showing an enlarged substantial part of a printed wiring board manufactured according to another embodiment of the present invention;

FIG. 4 is an explanatory front cross-sectional view showing an enlarged substantial part provided to explain a conventional printed wiring board manufacturing method of this kind, wherein

DESCRIPTION OF THE PREFERRED EMBODIMENTS

<<Printed Wiring Board F>>

A printed wiring board F will be described with reference to FIG. 5. The printed wiring board F is broadly classified into a flexible printed wiring board and a rigid printed wiring board. Each board is provided so that a circuit pattern 7 is formed on one side or both sides of an outer surface of an insulating material 1 as a conductor layer.

The flexible printed wiring board, which is a typical example of the printed wiring board F, is made of a flexible insulating material 1 such as a polyimide film serving as a base material. In many cases, the circuit pattern 7 is formed on both sides (i.e., both front and rear side, in other words, both one side and the other side) of the insulating material 1. On the other hand, the rigid printed wiring board is made of an insulating material 1, serving as a bas material, such as a glass epoxy resin, a glass cloth and ceramics, wherein the circuit pattern 7 is formed on one side (one of the front side and the rear side) of the insulating material 1 or on both sides thereof (both front side and rear side, in other words, both one side and the other side). The thickness of the insulating material 1 is normally between 201 μm and 60 μm, but an insulating material 1 of about 12 μm is also becoming available. The thickness of a copper foil 2 forming the circuit pattern 7 is normally between 4 μm and 35 μm. The space between the circuit patterns 7 is now between 10 μm and 301 μm and this has a tendency to be miniaturized.

In this specification, the printed wiring board F is described hereunder taking the flexible printed wiring board as an example. The printed wiring board F is formed in a film shape provided with flexibility and bendability as a whole and can be folded or bent three-dimensionally in use. Further, the progress of the printed wiring board F in high precision, high function, miniaturization, extreme thinness, lightness in weight and the like is remarkable as in the rigid printed wiring board, and high density and miniaturization of the formed circuit pattern 7 is outstanding.

Figure 5:
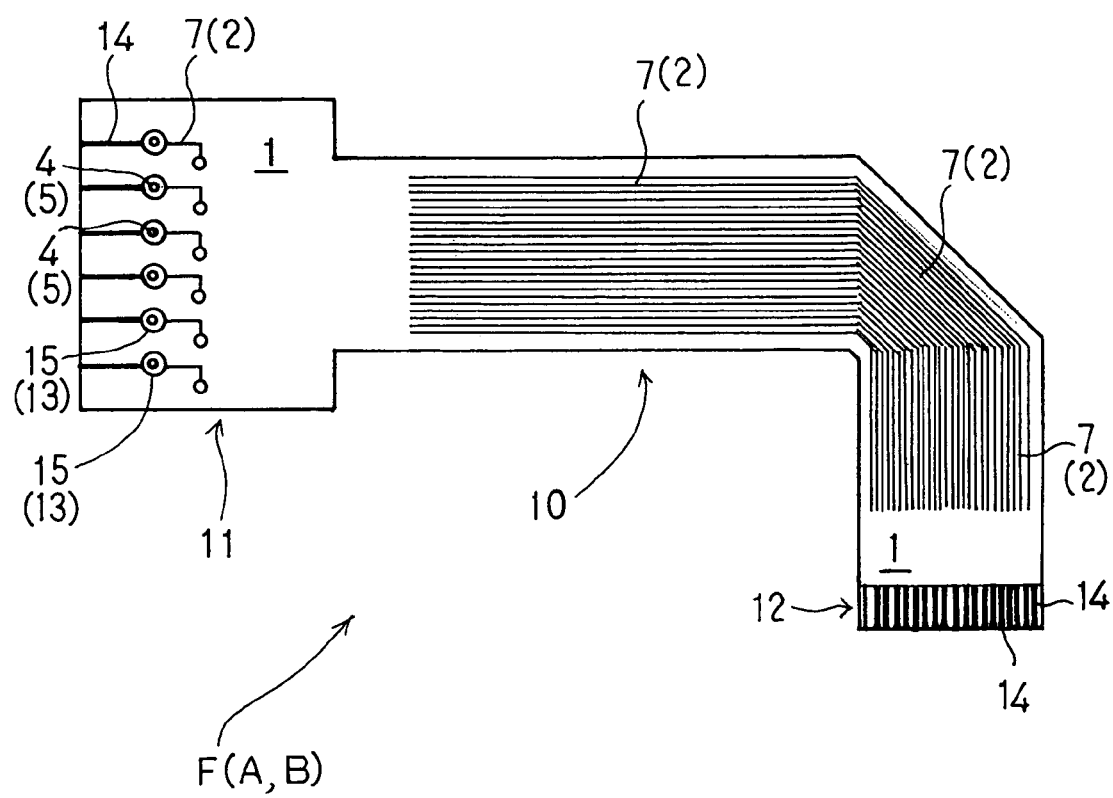
FIG. 5 is a schematic plan view showing an enlarged pattern of a printed wiring board.

FIG. 5 shows a flexible printed wiring board as an example of such a printed wiring board F and is broadly classified into a wiring end 11, a bendable wiring section 10 and a wiring end 12 in terms of a structural area. The central bendable section 10 is a location at which the printed wiring board F can be folded or bent in use, and each end of the wiring ends 111 and 12 is provided with a terminal 14. The bendable section 10 is generally formed with a circuit pattern 7 only on one of the two sides, while the wiring end 11 is formed with the circuit pattern 7 on both sides and is provided with a through-hole 4 and a land 15.

The printed wiring board F as shown in FIG. 5 is used as, for example, an optical pickup for read/write operations in a CD player and a DVD player.

The printed wiring board F is as outlined above.

<<Outline of Manufacturing Method>>

One embodiment of a manufacturing method for the printed wiring board F of the present invention will now be described with reference to FIGS. 1 through 3.

This manufacturing method comprises the steps of: making a large number of through-holes 5 for a through hole 4 in a substrate 3 made of a laminated sheet of which both sides are coated with copper; making the inside of each through-hole 5 electrically conductive; coating one side of the substrate 3 with a photosensitive dry film 16 having an outer masking layer 17 attached thereto; allowing a developing solution 18 to infiltrate into the through-holes 5 from the other side of the substrate; and developing the photosensitive dry film 16 as a plating resist.

This manufacturing method further comprises the steps of: exposing the photosensitive dry film 16 for hardening; removing the outer masking layer 17; copper-electroplating the inside of the through-holes 5; removing the photosensitive dry film; and forming a circuit pattern 7.

Such a manufacturing method will be described below in detail.

<<Substrate 3 to be Prepared>>

Figure 1A:
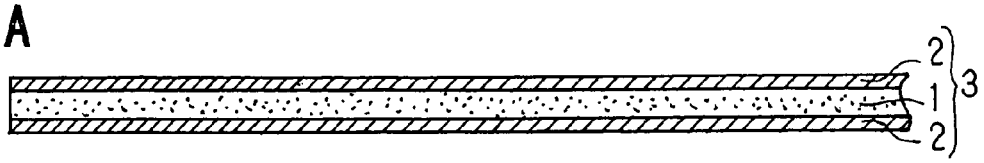
FIG. 1A shows a prepared substrate.

In the method for manufacturing the printed wiring board F, a substrate 3 is prepared as shown in FIG. 1A.

In the case of the flexible printed wiring board, the substrate 3 is also referred to as a film substrate and an insulating material 1 is also referred to as an insulating film. The substrate 3 is made of a laminated sheet of which both sides of the insulating material 1 are coated with a copper foil 2. The insulating material 1, that is, an insulating base material, is made of a polyimide resin film, an aramid resin film, a liquid crystal polymer film and other resin film provided with flexibility and insulation performance in the case of a flexible printed wiring board. A rolled foil, an electrolytic foil, a special electrolytic foil, a plating foil or the like is used as the copper foil 2.

A three-layer material type and a two-layer material type are available as such a substrate 3. In the case of the three-layer material, a copper foil 2 is laminated on both sides of the insulating material 1 through an adhesive agent. The adhesive agent includes an epoxy resin, a halogen-free epoxy resin, a high Tg epoxy resin and the like. In the two-layer material, the copper foil 2 is directly attached to both sides of the insulating material 1. The two-layer material is made using a casting method, a laminator method or a metalliding method (a sputtering method) or the like.

A laminated sheet of which both sides are coated with copper is broadly interpreted in this specification and includes various types of laminates. For example, a laminated sheet of which one side is coated with copper is also included in this context even though a copper foil is laminated on the other side by an adhesive agent.

The substrate 3 is as described above.

<<Drilling Process>>

Figure 1B:
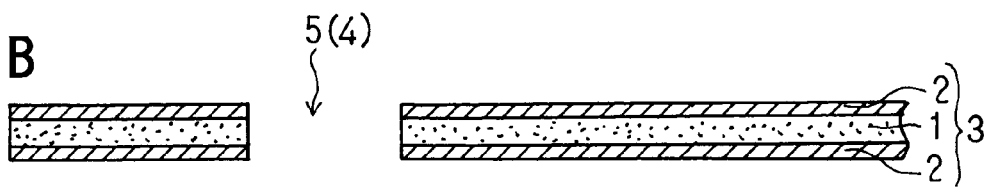
FIG. 1B shows a drilling process.

In this manufacturing method, as shown in FIG. 1B, a through-hole 5 for a through-hole 4 is made in the prepared substrate 3.

The through-hole 4 is a pore penetrating both sides (i.e., front side and rear side, in other words, one side and the other side) of the printed wiring board F. A large number of through-holes is made in one sheet of printed wiring board F. The through-hole 4 is used for electrically conducting between the circuit patterns 7 on both sides and for installing semiconductor parts and the like to be mounted on the circuit pattern 7. The diameter of the through-hole 4 is often between 0.2 mm and 0.5 mm. In the case of the through-hole made by a drilling method, the diameter is about 0.1 mm, while in the through-hole drilled by a laser, a diameter of about 0.05 mm is also available nowadays.

A large number of through-holes 5 to be used later as such a through-hole 4 is first made in the substrate 3. A drill, laser or the like is used for drilling and drilling operation is implemented using a NC (Numerical Control) machine tool in every sheet or in a roll (roll to roll).

The drilling operation is as described above.

<<Conductive Film 19 Forming Process>>

Figure 1C:
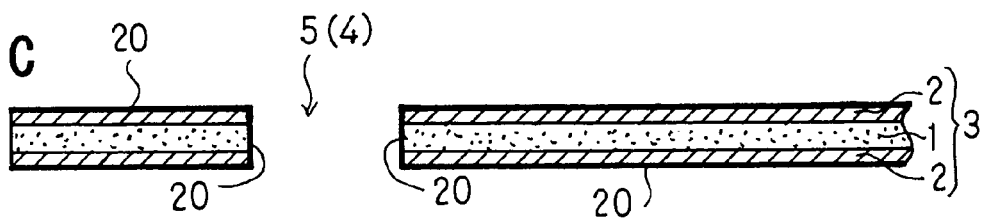
FIG. 1C shows a conductive film forming process.
Figure 1D:
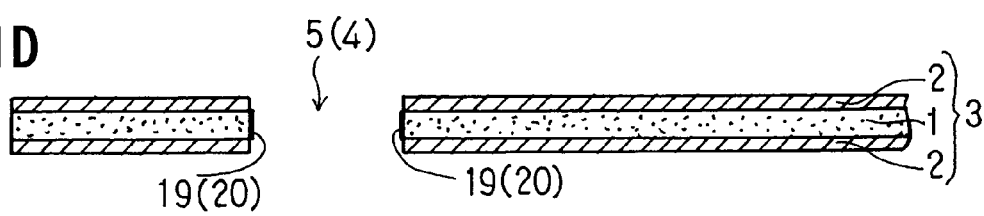
FIG. 1D shows a soft etching process.

In this manufacturing method, as shown in FIGS. 1C and 1D, a conductive film 19 is formed on the inner wall surface of the through-holes 5 of the substrate 3 in which such through-holes 5 were made, by a direct plating method or an electroless copper plating method.

Referring to the direct plating method as shown in FIG. 1, as shown in FIG. 1C, palladium or carbon treatment is thoroughly and continuously conducted on the entire substrate 3, that is, on the outer surface of the copper foil 2 attached to both sides of the substrate 3 and the inner wall surface of the through-holes 5, wherein a minute irregularity (i.e., concavity and convexity) of palladium or carbon 20 is applied as the conductive film 19.

Then, as shown in FIG. 1D, a soft etching is conducted to remove the conductive film 19 on the outer surface of the copper foil 2. In this manner, the conductive film 19 is directly applied only on the inner wall surface of the through-holes 5, to be more accurate, only on the surface of the insulating material 1 exposed on the inner wall surface of the through-holes 5, thereby adhering there to remain in that condition.

In this direct plating method, carbon graphite or other conductive materials can also be used in place of the palladium or carbon 20. However, in the case where the conductive film 19 is formed by the electroless copper plating without depending on such a direct plating method, the electroless copper plating is applied not only on the inner wall surface of the through-holes 5, but also on the outer surface of the copper foil 2 on both surfaces.

The conductive film 19 is formed as described above.

<<Coating Process by Photosensitive Dry Film 16 and the Like>>

Figure 1E:
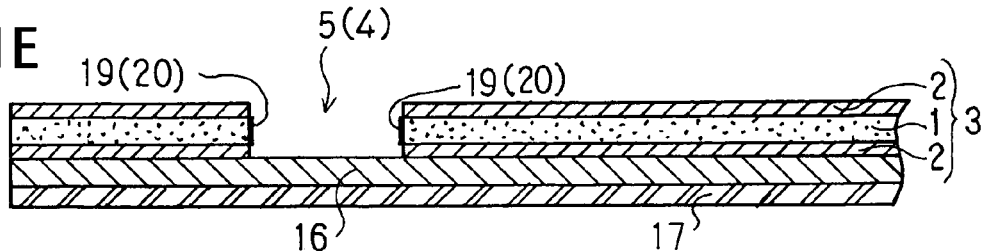
FIG. 1E shows a coating process and FIG. 1F shows a developing process.

In this manufacturing method, as shown in FIG. 1E, the through-hole 5 of the substrate 3 is formed with a conductive film 19. The whole area of one part of the outer surface of the substrate 3 is coated with a photosensitive dry film 16 having an outer masking layer 17 attached thereto. Namely, by attaching the photosensitive dry film 16 to the substrate 3, one side (rear side, that is, the lower side) of the substrate 3 is completely coated.

The outer surface (rear side, that is, the lower side) of the photosensitive dry film 16 attached in this manner is further coated with the outer masking layer 17 attached to the photosensitive dry film 16 later or in advance. Used as the outer masking layer 17 is a separator for protecting the surface of the photosensitive dry film 16, a PET resin film with a low adherent adhesive agent or other transparent materials with adhesion properties.

The substrate 3 is provided so that one side is coated with the photosensitive dry film 16 and the outer surface thereof is further coated with the outer masking layer 17.

Coating by the photosensitive dry film 16 and the like is implemented as described above.

<<Developing Process>>

Figure 1F:
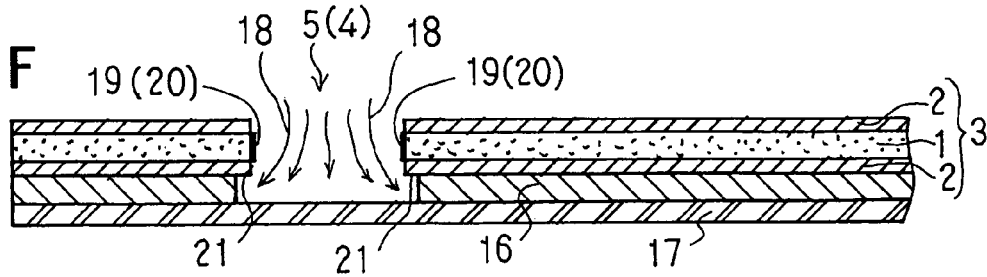

Further, according to this manufacturing method, as shown in FIG. 1F, the substrate 3 coated with the photosensitive dry film 16 and the like is developed. By allowing a developing solution 18 to infiltrate into the through-holes 5 from the other side of the substrate 3, the photosensitive dry film 16 in the vicinity of the opening of the through holes 5 on one surface is dissolved and removed by the developing solution 18. In this manner, the photosensitive dry film 16 left on one side is developed as a plating resist.

The developing solution 18 is sprayed from the other side (i.e., upper side) of the substrate 3, that is, from an open surface which is a non-masking surface on which no coating is applied, or the substrate 3 is entirely dipped in a tank of the developing solution 18.

The developing solution 18 infiltrates into the through-holes 5 from the other side (upper side) and goes through the through-holes 5 to partially dissolve and remove the photosensitive dry film 16 on one side (i.e., lower side). In other words, the developing solution 18 dissolves and removes an opening space of the through-holes 5 on one side and the periphery of the opening section 21 thereof. The dissolution and removal of a predetermined section of the through-holes 5 on one surface can be implemented at a proper area by controlling the concentration, temperature, injection pressure, injection time (dipping time) and the like.

The photosensitive dry film 16 is thus developed in a shape with a necessary hole as the plating resist by making use of a so-called liquid infiltration phenomenon and as a result, an opening of a diameter slightly larger than that of the through holes 5 is formed on one side of the through-holes 5.

The photosensitive dry film 16 is developed as described above.

<<Exposure Process>>

In this manufacturing method, as shown in FIG. 2A, the photosensitive dry film 16 developed in such a manner is exposed to harden the substrate 3.

The photosensitive dry film 16 formed in a shape with a necessary hole as the plating resist is immediately exposed (UV exposure) to be hardened by the photo polymerization and is developed.

The photosensitive dry film 16 is exposed as described above.

<<Stripping Process>>

Next, in this manufacturing method, as shown in FIG. 2B, the outer masking layer 17 is stripped away from the substrate 3.

In the substrate 3 in which the photosensitive dry film 16 has been developed, unlike the photosensitive dry film 16, the outer masking layer 17 maintaining a solid surface shape with no hole is stripped and removed from the outer surface of the photosensitive dry film 16 which has become the plating resist.

The outer masking layer 17 is stripped away as described above.

<<Plating Process>>

In this manufacturing method, as shown in FIG. 2C, a copper electroplating 6 is applied on the substrate 3 from which the outer masking layer 17 has been stripped to separate out the copper from the copper foil 2 on the other side, from the conductive film 19 on the inner wall surface of the through-holes 5, and from the periphery of the opening section 21 of the through-holes 5 on one side. With this process, the through-holes 5 are made electrically conductive.

Namely, the copper electroplating is applied on a section of the substrate 3 which has not been masked by the photosensitive dry film 16 developed and hardened as the plating resist.

In this manner, the copper is thoroughly and continuously separated from the outer surface of the copper foil 2 on the other side (upper side of FIG. 2), from the conductive film 19 forming the inner wall surface of the through-holes 5, and from the periphery of the opening section 21 of the through-holes 5 on one side (lower side of FIG. 2) for copper electroplating 6. The copper electroplating 6 formed on the periphery of the opening section 21 of the through-holes on one side is formed concentrically with the through-holes 5 as a button section D of a flange shape, that is, of a collar shape.

The copper electroplating 6 is implemented as described above.

<<Stripping Process>>

In this manufacturing method, as shown in FIG. 2D, the photosensitive dry film 16 is stripped away.

Namely, by spraying the substrate 3 on which the copper electroplating 6 has been applied with a parting (i.e., release) solution, the photosensitive dry film 16 used as the plating resist is stripped and removed.

The photosensitive dry film 16 is stripped away as described above.

<<Patterning Process>>

In this manufacturing method, after going through each process described above, as shown in FIG. 2E, a circuit pattern 7 is formed on both sides of the substrate 3 by following the known steps.

Namely, the circuit pattern 7 is formed by copper foil on both sides of the substrate 3 by following, for example, the known steps of attaching the photosensitive dry film to both sides of the substrate 3; exposing the photosensitive dry film using a photo mask which is a negative mask of a circuit pattern 7 (that is, baking the circuit pattern 7); developing and drying for removing the unexposed photosensitive dry film; etching the copper foil 2 on the section where the photosensitive dry film is opened; and stripping the photosensitive dry film.

In this manner, the printed wiring board F is manufactured as shown, for example, in FIG. 2E and FIG. 5. Semiconductor parts and the like are mounted on the printed wiring board F manufactured in this manner for use.

A film type and a glass type are available as the photo mask, that is, the negative mask serving as a circuit mask, which is used to form such a circuit pattern 7.

Patterning is implemented as described above.

<<Operation and the Like>>

Preferred embodiments for the method for manufacturing the printed wiring board F of the present invention are shown in FIGS. 1 and 2 and are constructed as above.

Namely, the manufacturing method as shown in FIGS. 1 and 2 comprises the steps of: making a large number of through-holes 5 (for a through hole 4) (refer to FIG. 1B) in a substrate 3 (refer to FIG. 1A) made of a laminated sheet of which both sides are coated with copper; forming a conductive film 19 on the inner wall surface of each through-hole 4 (refer to FIGS. 1C and 1D); and coating one side of the substrate 3 with a photosensitive dry film 16 and an outer masking layer 17 (refer to FIG. 1E).

The manufacturing method further comprises the steps of: pouring the developing solution 18 into the through-holes 5 from the other side of the substrate 3; dissolving and removing the photosensitive dry film 16 in the vicinity of the opening of the through-holes on one side; developing the photosensitive dry film 16 as a plating resist for exposing and hardening (refer to FIGS. 1F and 2A).

The substrate 3 is then copper electroplated. Namely, after stripping the outer masking layer 17 (refer to FIG. 2B), copper is restrictively and continuously separated out from the copper foil 2 on the other side, from the conductive film 19 on the inner wall surface of the through-holes 5, and from the periphery of the opening section 21 of the through-holes 5 on one side for copper electroplating 6, thereby making the through-holes 5 electrically conductive between one side and the other side (refer to FIG. 2C).

The manufacturing method further comprises the steps of: stripping the photosensitive dry film 16 from the substrate 3 (refer to FIG. 2D); patterning the copper foil 2 of the substrate 3; and forming the circuit pattern 7 (refer to FIG. 2E).

According to the manufacturing method of the embodiments as shown in FIGS. 1 and 2 of the present invention, the following four points are to be noted.

(1) First, this manufacturing method comprises the steps of: coating one side of the substrate 3 with the photosensitive dry film 16, which is a plating resist, for masking; and copper electroplating the limited area. In this manner, copper is not separated out from the copper foil 2 of the substrate 3 on one side except for the periphery of the opening section 21 of the through-holes 5. As a result, no copper electroplating 6 is applied on the copper foil 2.

The printed wiring board F manufactured according to this manufacturing method has a circuit pattern 7 formed on both sides of the substrate 3 by such a copper foil 2, wherein no copper electroplating 6 is applied on the circuit pattern 7 of the substrate 3 on one side (lower side) and thus, copper is not separated out.

In the case where the printed wiring board F uses one such side as a bendable surface (As described above, it is often the case that the circuit pattern 7 is formed only on one of the two sides of a bendable wiring section 10. In this case, one such side which is not copper electroplated is used as the circuit pattern 7 side), this generally excels in flexibility and bendability compared to the case where the copper foils 2 on both sides and the circuit pattern 7 are copper electroplated together.

For example, the printed wiring board F manufactured according to this manufacturing method can be folded or bent smoothly at a location situated at a central section to be a bendable wiring section 10 relative to a wiring end 11 situated at an end to dispose a through-hole 4 (refer to FIG. 5).

(2) Second, in the printed wiring board F manufactured according to the manufacturing method, no copper electroplating is applied on the circuit pattern 7 on one surface.

Accordingly, the printed wiring board F is light in weight and becomes thinner compared to the case where the circuit pattern 7 on both sides is copper electroplated and the copper is separated out therefrom.

Since the copper electroplating 6 is not applied on the copper foil 2 of the printed wiring board F on one side, etching can be conducted more smoothly on one side compared to the case where the copper electroplating 6 is applied and the copper is separated out. As a result, it is possible to form the high-density, miniaturized circuit pattern 7.

(3) Third, this manufacturing method adopts a method whereby one side of the substrate 3 is coated with the photosensitive dry film 16 and the outer masking layer 17 before pouring the developing solution 18 into the through-holes 5 from the other side. In this manner, the photosensitive dry film 16 can be correctly and evenly dissolved and removed in the vicinity of the opening of the through-holes on one side and as a result, the film 16 can be properly developed.

Figure 4A:
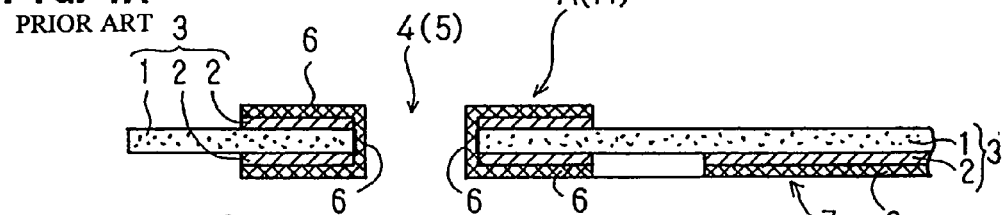
FIG. 4A shows a printed wiring board manufactured according to a panel plating method.
Figure 4B:
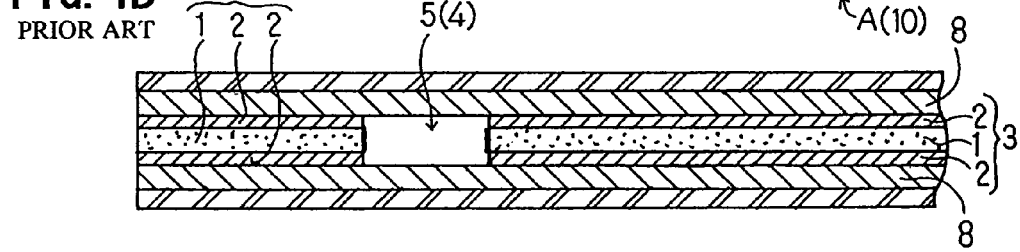
FIG. 4B shows a coating process according to a button plating method.
Figure 4C:
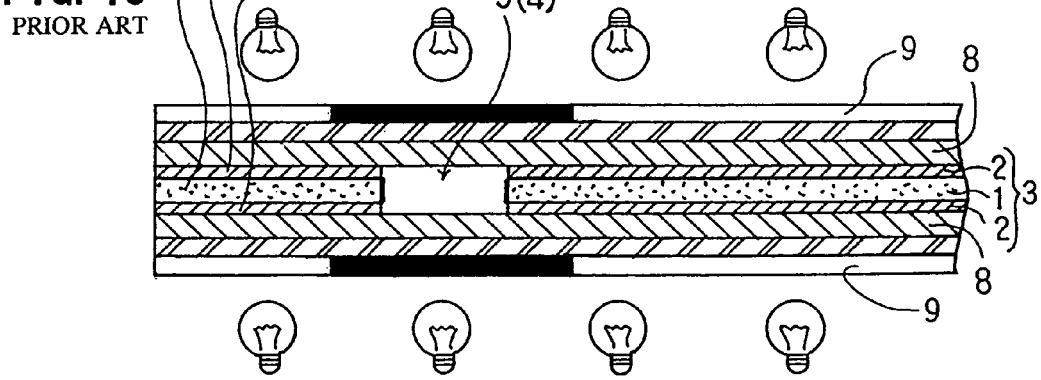
FIG. 4C shows an exposure process according to the button plating method and FIG. 4D shows a printed wiring board manufactured according to the button plating method.
Figure 4D:
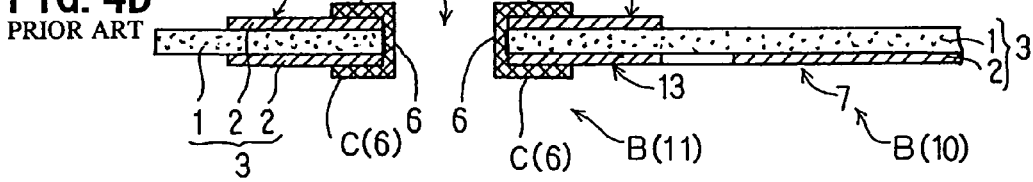

According to this manufacturing method, the manufacturing process can not only be reduced and simplified compared to a method whereby a photo mask 9 is used to form the plating resist (refer to FIGS. 4B, 4C and 4D), but also a troublesome positioning operation of the photo mask 9 and the through-holes 5 is not required.

(4) Fourth, this manufacturing method adopts a method whereby a developing solution 18 is poured into the through-holes 5 from the other side of the photosensitive dry film 16 coating one side of the substrate 3. Accordingly, the photosensitive dry film 16 is correctly and evenly dissolved and removed only in the vicinity of the opening of the through-holes 5 on one side and is developed as a plating resist with an extremely high degree of accuracy.

In the printed wiring board F manufactured according to this manufacturing method, the copper electroplated button section D is correctly and evenly formed in a flange shape, that is, in a collar shape on the periphery of the opening section 21 of the through-holes 5, that is, a through-hole 4 on one side. In other words, the printed wiring board F is provided in such a manner that the button section D for connecting to (a land section 15 of) the circuit pattern 7 is formed with high positioning and dimensional accuracy without depending on visual inspection operation and without being affected by the expansion and contraction of the substrate 3 and the photo mask 9 (refer to FIGS. 4B, 4C and 4D).

The printed wiring board F is further provided so that the minute button section D of which the diameter has been reduced, for example, to the extent of about 50 μm can be formed as shown in FIG. 3A based on such high accuracy (refer to FIG. 3B for comparison in which the diameter of a conventional button section C of this kind is about 0.2 mm). As a result, the printed wiring board F is provided to make the diameter of the land 15 on a side of the circuit pattern 7 accordingly smaller.

According to this printed wiring board F, enough space is created between the lands 15 in the wiring end 11 (refer to FIG. 5) and as a result, the amount and density of wiring of the circuit pattern 7 to be put between the lands 15 can be easily and freely increased or changed (refer to FIG. 3C and FIG. 3D for comparison. FIG. 3D shows a conventional example of this kind).

Other Embodiment

The method for manufacturing the printed wiring board F of the present invention is not limited to the example of FIGS. 1 and 2 as described above, that is, to the example in which the button section D is formed on one side of the substrate 3, but the button section D can also be formed on both sides of the substrate 3 as shown in FIG. 3E.

In the example of FIG. 3E, by partially repeating the intermediate process, the button section D which excels in accuracy can be formed not only on one side, but also on the other side. As a result, as shown in FIG. 3E, it is possible to form the miniaturized button section D of which the diameter has been reduced and which excels in accuracy on both sides (both front and rear side, that is, both one side and the other side).

In the manufacturing method of FIG. 3E, a coating step, a developing step and an exposure step by the photosensitive dry film 16 and the like and a stripping step of the outer masking layer 17 are implemented in that order on one side of the substrate 3 as in the examples of FIGS. 1 and 2 described above. With reference to the other side of the substrate 3, a coating step, a developing step and an exposure step of the photosensitive dry film 16 and a stripping step of the outer masking layer 17 are also implemented in that order to proceed to a plating step.

These steps will be further described below. First, a through-hole 5 provided with a conductive film 19 is made in a substrate 3. One side of the substrate 3 is coated with a photosensitive dry film 16 as a plating resist. The photosensitive dry film 16 is then developed and hardened, and an outer masking layer 17 for the photosensitive dry film is stripped and removed.

The other side of the substrate 3 is also coated with a photosensitive dry film 16 as a plating resist. The photosensitive dry film 16 is then developed and hardened (In this case, a developing solution 18 is caused to infiltrate into the through-hole 5 from one side) and an outer masking layer 17 for the photosensitive dry film 16 is stripped and removed.

After these steps, copper electroplating 6 is conducted. This copper electroplating 6 is applied only on the inside of the through-hole 5 and the opening section 21 on both sides unlike the examples of FIGS. 1 and 2.

The substrate 3 is then patterned after stripping and removing the photosensitive dry film 16 on both sides.

In the manufacturing method of the example of FIG. 3E, copper electroplating 6 is applied on the inside of the through-holes 5 of the substrate 3, that is, on the inside of the through-hole 4. On the other hand, only the periphery of the opening section 21 of the through-hole 4 on both surfaces, that is, on one side and the other side, is also copper electroplated (In the examples of FIGS. 1 and 2, as described above, the copper electroplating 6 is applied on the inside of the through-hole 4, the periphery of the opening section 21 on one side, and the whole area of the copper foil 2 on the other side). In this manner, the printed wiring board F in which the button section D is formed on both sides is manufactured.

Since the copper electroplating 6 is not applied on the copper foil 2 on both sides and the circuit pattern 7, the manufactured printed wiring board F not only excels in flexibility and bendability, [see item (1)], but also excels in weight, thickness, high density and miniaturization [see item (2) above].

In the examples as described above, the flexible printed wiring board is described as the printed wiring board F, but the manufacturing method of the printed wiring board F of the present invention is not limited to this, but is also applicable to a rigid printed wiring board.

What is claimed is:

1. A printed wiring board manufacturing method comprising the steps of:
   (a) making a large number of through-holes in a laminated sheet coated with copper, said laminated sheet having first and second sides and said through holes having through-hole interior surfaces;
   (b) making the through-hole interior surfaces electrically conductive;
   (c) coating the copper on the first side of the laminated sheet with a photosensitive dry film having an outer masking layer attached thereto;
   (d) allowing a developing solution to infiltrate into the through-holes from the second side;
   (e) developing the photosensitive dry film as a plating resist for hardening, said photosensitive dry film being developed in an area of outer peripheries of said through holes on said first side of the laminated sheet;
   (f) removing the outer masking layer;
   (g) copperizing the through-holes and the outer peripheries thereof;
   (h) removing the photosensitive dry film; and
   (i) forming a circuit pattern.

2. A printed wiring board manufacturing method comprising the steps of:
   (a) making a large number of through-holes in a laminated sheet coated with copper on first and second sides, said through holes having through-hole interior surfaces;
   (b) making the through-hole interior surfaces electrically conductive;
   (c) coating the first side of the laminated sheet with a first photosensitive dry film having a first outer masking layer attached thereto;
   (d) allowing a developing solution to infiltrate into the through-holes from the second side;
   (e) developing the first photosensitive dry film as a plating resist for hardening, said first photosensitive dry film being developed in an area of outer peripheries of said through holes on said first side of the laminated sheet;
   (f) removing the first outer masking layer;
   (g) coating the second side with a second photosensitive dry film having a second outer masking layer attached thereto;

(h) allowing a developing solution to infiltrate into the through-holes from the first side;

(i) developing the second photosensitive dry film as a plating resist for hardening, said second photosensitive dry film being developed in an area of outer peripheries of said through holes on said second side of the laminated sheet;

(j) removing the second outer masking layer (k) copperizing the through-holes and the peripheries of the through-holes on said first and second sides;

(l) removing said first and second photosensitive dry films; and (m) forming a circuit pattern.

3. A printed wiring board manufacturing method comprising the steps of:

(a) making a large number of through-holes in a substrate made of a laminated sheet of which first and second sides of an insulating material are coated with a copper foil such that said substrate has first and second sides which are surfaced with the copper foil, and said through-holes having through-hole interior surfaces;

(b) forming a conductive film on the through-hole interior surfaces of the through-holes;

(c) coating a whole area of the first side of the substrate with a photosensitive dry film having an outer masking layer attached thereto;

(d) allowing a developing solution to infiltrate into the through-holes from the second side of the substrate to dissolve and remove the photosensitive dry film in a vicinity of openings of the through-holes on the first side by a developing solution, thereby developing the photosensitive dry film as a plating resist for hardening;

(e) stripping the outer masking layer; and (f) copper-electroplating the substrate to apply copper to the copper foil of the second side, to the conductive film of the through-hole interior surfaces of the through-holes, and to the vicinities of peripheries of the through-holes on the first side, thereby causing the through-holes to become electrically conductive;

(g) stripping the photosensitive dry film; and (h) forming a circuit pattern in the copper foil on the first and second sides of the substrate.

4. The printed wiring board manufacturing method according to claim 1, wherein the printed wiring board is a film-shaped flexible printed wiring board.

5. The printed wiring board manufacturing method according to claim 1, wherein the printed wiring board is a rigid printed wiring board.

6. The printed wiring board manufacturing method according to claim 1, wherein an electrical conduction treatment used to make the through-hole interior surfaces conductive is implemented by a direct plating method whereby a film of palladium, carbon or other conductive material is formed, or an electroless copper plating method whereby a film is formed by an electroless copper plating.

7. The printed wiring board manufacturing method according to claim 1 wherein infiltration of the developing solution into the through-holes is implemented by spraying the developing solution onto the substrate or dipping the substrate into a developing solution tank.

8. The printed wiring board manufacturing method according to claim 1, wherein the forming of the circuit pattern is implemented in such a manner that the substrate is coated with a photosensitive resist film, the photosensitive resist film is exposed, hardened, and developed using a circuit mask, and a copper foil of the substrate is etched to strip away the remaining photosensitive resist film.

* * * * *